(12) United States Patent
Angeli et al.

(10) Patent No.: US 9,599,520 B2
(45) Date of Patent: Mar. 21, 2017

(54) METHOD FOR DETERMINING AND OPERATING TEMPERATURE OF AN ELECTRONIC COMPONENT

(71) Applicant: Dialog Semiconductor GmbH, Kirchheim/Teck-Nabern (DE)

(72) Inventors: Alessandro Angeli, Munich (DE); Michele DeFazio, Germering (DE); Stefano Scaldaferri, Bientina (IT); Christian Wolf, Gauting (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 580 days.

(21) Appl. No.: 14/086,377

(22) Filed: Nov. 21, 2013

(65) Prior Publication Data

US 2015/0001965 A1   Jan. 1, 2015

(30) Foreign Application Priority Data

Jun. 28, 2013   (EP) ..................... 13174354

(51) Int. Cl.
    *G01K 13/00*   (2006.01)
    *G01R 19/00*   (2006.01)
    *G06F 1/20*    (2006.01)
    *G06F 1/32*    (2006.01)
    (Continued)

(52) U.S. Cl.
    CPC ............ *G01K 13/00* (2013.01); *G01K 7/427* (2013.01); *G01R 19/00* (2013.01); *G01R 21/06* (2013.01); *G06F 1/206* (2013.01); *G06F 1/329* (2013.01); *G01K 2217/00* (2013.01);
    (Continued)

(58) Field of Classification Search
    None
    See application file for complete search history.

(56) References Cited

U.S. PATENT DOCUMENTS

| | | | |
|---|---|---|---|
| 6,744,831 B2* | 6/2004 | Chan ..................... | H04B 1/586 |
| | | | 375/219 |
| 2006/0171662 A1* | 8/2006 | Nagata .................... | G06F 1/206 |
| | | | 386/241 |
| 2010/0134150 A1 | 6/2010 | Park et al. | |

(Continued)

FOREIGN PATENT DOCUMENTS

EP   1 679 574   7/2006

OTHER PUBLICATIONS

European Search Report, 13174354.4-1959, Mailed: Aug. 25, 2014.
(Continued)

*Primary Examiner* — Jared Fureman
*Assistant Examiner* — Aqeel Bukhari
(74) *Attorney, Agent, or Firm* — Saile Ackerman LLC; Stephen B. Ackerman

(57) ABSTRACT

A method for determining the temperature of an electronic component in an electronic device comprises supplying a current to the electronic component via a power converter device, measuring an input current supplied to the power converter device, determining a power dissipation of the electronic component based on the measured input current, a value for an efficiency of the power converter device and an output voltage of the power converter device, and determining the temperature of the electronic component based on the determined power dissipation and a thermal resistance value for the electronic component.

20 Claims, 4 Drawing Sheets

(51) Int. Cl.
*G01R 21/06* (2006.01)
*G01K 7/42* (2006.01)

(52) U.S. Cl.
CPC ......... *Y02B 60/1275* (2013.01); *Y02B 60/144* (2013.01); *Y10T 307/773* (2015.04)

(56) References Cited

U.S. PATENT DOCUMENTS

| | | | |
|---|---|---|---|
| 2010/0164553 A1* | 7/2010 | Ha | H02M 3/156 327/103 |
| 2010/0180089 A1 | 7/2010 | Flemming et al. | |
| 2010/0217454 A1 | 8/2010 | Spiers et al. | |
| 2012/0158331 A1* | 6/2012 | Chung | G01R 31/42 702/64 |
| 2013/0128396 A1* | 5/2013 | Danesh | G01R 19/00 361/45 |

OTHER PUBLICATIONS

European Search Report, 13174354.4-1959, Mailed: Oct. 29, 2014.
German Office Action, Application No. 13 174 354.4-1879, Applicant: Dialog Semiconductor GmbH, Mail Date: Jan. 18, 2017, 6 pgs.
"Switched-mode power supply—Wikipedia," Jun. 14, 2013 (Jun. 14, 2013), XP055334328, Retrieved from the Internet: (https://en.wikipedia.org/wiki/Switched-mode_power_supply), 27 pgs.

* cited by examiner

METHOD FOR DETERMINING AND OPERATING TEMPERATURE OF AN ELECTRONIC COMPONENT

TECHNICAL FIELD

The present document relates to electronic circuits. In particular, the present document relates to determining the operating temperature of an electronic component in a fast and accurate manner. It further relates to a power converter for supplying a current to an electronic component.

BACKGROUND

One of the limitations to achieving high performance in small electronic devices such as portable communication devices is the heating of the device due to power dissipation and the inability to use bulky cooling systems. It is common practice to place several temperature sensors across the device and use them to measure the temperature increase of various device components. However, such temperature sensors will measure an average temperature of their surroundings, thus making it difficult to exactly locate the source of a temperature increase. Thus, in case of the operating temperature of a certain region of the device reaching a predetermined upper limit, several components of the device will have to be shut down in order to prevent damage. This leads to a reduced performance of the device.

There is thus a need to provide a method and a device for providing an accurate and fast temperature measurement of individual electronic components.

SUMMARY OF THE DISCLOSURE

A principal object of the present disclosure is to provide an accurate and fast temperature measurement of individual electronic components of an electronic device.

A further object of the disclosure is to determine the temperature of the electronic component based on the determined power dissipation and a thermal resistance value for the electronic component.

A further object of the disclosure is to determine the temperature of the electronic component without the need for a separate temperature sensor.

A further object of the disclosure is to determine the temperature of the electronic component wherein the determined temperature is not influenced by any temperature rises or drops in surrounding components.

A further object of the disclosure is to identify an overheating electronic component and to specifically control its operation without the need for shutting down any further electronic components.

A further object of the disclosure is to determine the power dissipation by determining the current supplied to the electronic component by the power converter and determining the power dissipation from the supplied current and the output voltage of the power converter device.

In accordance with the objects of this disclosure a method for determining the temperature of an electronic component in an electronic device has been achieved. The method disclosed firstly comprises the steps of: providing a power converter device, supplying a current to the electronic component via a power converter device, and measuring an input current supplied to the power converter device. Furthermore the method comprises the steps of determining a power dissipation of the electronic component based on the measured input current, a value for an efficiency of the power converter device and an output voltage of the power converter device, and determining the temperature of the electronic component based on the determined power dissipation and a thermal resistance value for the electronic component.

In accordance with the objects of this disclosure a power converter for supplying a current to an electronic component has been achieved. The power converter firstly comprises: a main pass device connected to the electronic component, an auxiliary pass device connected in parallel to the main pass device and switched together with the main pass device based on a converter control signal, and a sense resistor connected in series to the auxiliary pass device. Furthermore the power converter comprises: an amplifier circuit for amplifying a voltage drop across the sense resistor, a calibration resistor connectable with the amplifier circuit such that a voltage drop across the calibration resistor corresponds to a voltage drop at the sense resistor for a zero output current supplied to the electronic component, and a converter circuit for providing a value indicative of the current that is supplied to the electronic component, based on a measured voltage at the output of the amplifier circuit.

According to an aspect, a method for determining the temperature of an electronic component in an electronic device is provided. The method comprises supplying a current to the electronic component via a power converter device. An input current supplied to the power converter device is measured and a power dissipation of the electronic component is determined based on the measured input current, a value for an efficiency of the power converter device and an output voltage of the power converter device. The temperature of the electronic component is then determined based on the determined power dissipation and a thermal resistance value for the electronic component. Thus, the temperature of the electronic component can be determined in a fast and accurate manner without the need for a separate temperature sensor. Further, the temperature of a specific electronic component can be determined, wherein the determined temperature is not influenced by any temperature rises or drops in surrounding components. Thus, an overheating electronic component can be identified and its operation can be specifically controlled without the need for shutting down any further electronic components.

According to embodiments, the step of determining the power dissipation may comprise determining the current supplied to the electronic component by the power converter and determining the power dissipation from the supplied current and the output voltage of the power converter device. Thus, using the known output voltage of the power converter device, the power dissipation may be determined accurately from the current and voltage supplied to the electronic component by the power converter device.

According to embodiments, the step of determining the power dissipation of the electronic component may comprise calculating the power dissipated in the electronic component based on the efficiency η of the power converter device, the voltage $V_{in}$ supplied to the power converter device, and the input current $I_{in}$ to the power converter device. For battery operated devices, the input current $I_{in}$ to the power converter device may correspond to a battery current $I_{BAT}$ supplied by the device's battery.

In particular, the provided power to the electronic component may be calculated according to:

$$P = \eta * V_{in} * I_{in}$$

According to embodiments, the step of determining the temperature of the electronic component may be based on the ambient temperature $T_A$, the thermal resistance θ for the electronic component and the power dissipation P of the electronic component.

The temperature T of the electronic component may be calculated according to:

$$T=T_A+\theta*P$$

Therein, the overall thermal resistance for the electronic component may be determined as the sum of individual thermal resistance values, such as e.g. relevant individual thermal resistance values for the electronic component package and for its junction element.

According to embodiments, the step of determining the temperature of the electronic component may comprise obtaining values for the power dissipation of the electronic component for a first task and a second task performed by the electronic component. Then, a change in temperature, ΔT, of the electronic component may be calculated when the electronic component changes from performing the first task to performing the second task according to:

$$\Delta T=\theta*\Delta P$$

wherein θ is the thermal resistance for the electronic component and ΔP is the difference in power dissipation of the electronic component for the first and the second task. Thus, for known tasks, the change in temperature of the electronic component can be predicted in a fast and accurate manner even before the temperature has started rising due to a change in task performed by the electronic component.

Thus, the device operation can be controlled such that the temperature of the electronic component can be kept below a predetermined threshold temperature. Using the current temperature of the electronic component and the expected temperature change due to a scheduled task, the temperature can be predicted for a given task that is to be performed by the electronic component. If, for example, the current temperature of an electronic component is at a value close to the predetermined threshold, any power-intensive tasks scheduled for this electronic component may need to be postponed until the temperature of the electronic component has been lowered by a cooling system of the electronic device, or such a power-intensive task could instead be performed by a different electronic component of the device.

According to embodiments, the method may further comprise providing the determined temperature of the electronic component to a control system of the electronic device, e.g. an operating system of the electronic device. Then, a power supply to the electronic component and/or an operation of the electronic component may be controlled according to the determined temperature of the electronic component. Thus, excessive increases in temperature of any single electronic component can be avoided by controlling the operation of the electronic component accordingly as soon as the temperature rises above a predetermined threshold value or as soon as the increase in temperature is faster than a predetermined gradient. By controlling the operation of single electronic components, the overall performance of the device can be maintained at a high level, as only those electronic components that actually experience a rise in temperature will be affected while surrounding components can continue normal operation.

According to embodiments, the step of measuring an input current supplied to the power converter device may be performed using an auxiliary pass device connected in parallel to a main power converter pass device and switched together with the main power converter pass device, using a known relationship between the currents in the auxiliary and the main pass device. Such an auxiliary pass device ensures that the current flow in the main pass device is not affected by the measurement of the input current. Further, a sense resistor may be connected in series to the auxiliary pass device and the step of measuring the input current may comprise determining a voltage drop across the sense resistor. Thus, the input current can be measured in a particularly easy and robust manner, while the main power path of the power converter pass device remains free of any additional resistors which would cause a power loss in the power supply path to the electronic component.

Therein, a calibration resistor may be arranged in parallel to the sense resistor such that a voltage drop across the calibration resistor corresponds to a voltage drop at the sense resistor for a zero output current. The zero output current corresponds to a situation when the power converter is providing a zero load current, so that, if the current measurement is performed using an amplifier circuit, the bias current of the amplifier circuit flowing in the sense resistor equals the current that is flowing in the calibration resistor (when calibrating) thus generating the same voltage drop at the input of the amplifier circuit.

The step of measuring an input current may comprise determining the voltage drop at the sense resistor, determining the voltage drop at the calibration resistor, and determining a difference between the voltage drop at the sense resistor and the voltage drop at the calibration resistor. By subtracting the voltage drop at the calibration resistor from the voltage drop at the sense resistor, any voltage offsets that are produced within the power converter device even when zero current is supplied to the electronic component can be cancelled out. Thus, the difference between the voltage drop at the sense resistor and the voltage drop at the calibration resistor is directly proportional to the current supplied to the electronic component.

According to embodiments, only a positive current flowing through a power converter pass device may be considered for determining the power dissipation of the electronic component. Therein, a positive current is defined as a current flowing into the electronic component. Thus, the determined temperature will not be influenced by current artifacts generated due to e.g. a reduction in output voltage of the power converter device or negative current flowing from the inductor back to the voltage source during switching of the power converter device.

According to a second aspect, a power converter for supplying a current to an electronic component is provided, comprising a main pass device connected to the electronic component and an auxiliary pass device connected in parallel to the main pass device and switched together with the main pass device based on a converter control signal. Therein, a sense resistor is connected in series to the auxiliary pass device and an amplifier circuit is provided for amplifying a voltage drop across the sense resistor. Thus, the current flow in the main pass device is not affected by the sense resistor. The amplifier circuit outputs a signal proportional to a voltage drop across the sense resistor which is indicative of a current through the sense resistor and thus a current through the auxiliary pass device. Using a known relationship between the current in the auxiliary pass device and the current in the main pass device, the voltage drop across the sense resistor can thus be used to determine the current flow through the main pass device.

A calibration resistor may be connected with the amplifier circuit such that a voltage drop across the calibration resistor corresponds to a voltage drop at the sense resistor for a zero output current supplied to the electronic component.

Further, a converter circuit may be provided for providing a value indicative of the current that is supplied to the electronic component, based on a measured voltage at the output of the amplifier circuit. The converter circuit may comprise an analog-to digital converter connected to the output of the amplifier circuit. The input signal of the analog-to-digital converter may be the amplified voltage drop across the sense resistor which is proportional to the current supplied to the electronic component, as described above. Thus, the current supplied to the electronic component can be determined in a fast and accurate manner without influencing the performance of the power converter, as the main pass device of the power converter remains free of any additional resistors and sensing circuitry.

According to embodiments, the power converter may further comprise a first switch connecting the calibration resistor with an input of the amplifier circuit, a second switch connecting the sense resistor with the input of the amplifier circuit, and a switch control unit for controlling the first and second switch. Therein, the converter circuit may be configured to measure the voltage at the output of the amplifier circuit when the first switch connects the calibration resistor with the amplifier circuit, and to measure the voltage at the output of the amplifier circuit when the second switch connects the sense resistor with the amplifier circuit. Thus, each measurement may comprise measuring the voltage drop in turn both at the calibration resistor and at the sense resistor by connecting the amplifier circuit to the respective resistor via the respective switch. The measurement is controlled by the switch control unit which causes the first and second switches to alternately open and close. The difference between the output voltage of the amplifier circuit when the first switch connects the calibration resistor with the amplifier circuit and when the second switch connects the sense resistor with the amplifier circuit may be determined. Thus, a "baseline" or offset output voltage can be determined for each measurement based on the voltage drop measured at the calibration resistor and can be subtracted from the voltage drop measured at the sense resistor in order to reach an accurate value for the current supplied to the electronic component.

According to embodiments, the amplifier circuit may comprise a differential amplifier which amplifies a voltage drop across the sense resistor or across the calibration resistor as controlled by the switch control unit which alternately opens/closes the first and second switch. Further, a field effect transistor may be provided. The gate of the field effect transistor may be connected with the output of the differential amplifier. A first terminal of the field effect transistor may be connected with a negative input terminal of the differential amplifier, and a second terminal may be the output of the amplifier circuit.

Therein, the amplifier circuit may further comprise a first and a second input resistor preferably having the same resistance value. The first input resistor may be connected with the power converter input voltage and the negative input terminal of the differential amplifier. A terminal of the second input resistor may be connected with the first and second switches and another terminal of the second input resistor may be connected with a positive input terminal of the differential amplifier.

According to embodiments, the power converter may further comprise a passive network connected with the output of the amplifier circuit. The passive network may comprise a resistor. The input of the converter circuit may be connected to a terminal of the resistor, such that the resistor can be used for scaling the input value of the converter circuit by providing a measured voltage caused by current flowing through the resistor. In this arrangement, the gain of the amplifier circuit is determined by the ratio of the resistance of the passive network resistor to the resistance of the amplifier circuit input resistors.

The passive network may further comprise a capacitor connected in parallel to the resistor in order to provide a low-pass filter of current ripples produced by the power converter during measurement of the voltage drop across the sense resistor.

The present description is mainly directed at embodiments of a method. However, it is to be understood, that any features described in terms of method steps may also be implemented as device features and vice versa.

BRIEF DESCRIPTION OF THE DRAWINGS

The invention is explained below in an exemplary manner with reference to the accompanying drawings.

DESCRIPTION

Figure 1:
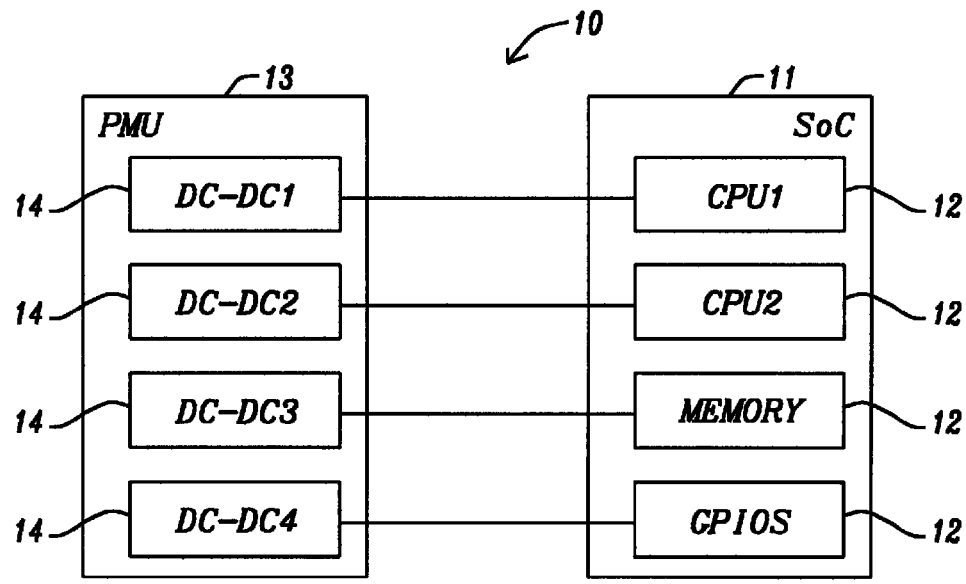
FIG. 1 shows a schematic overview of a device wherein an embodiment of the above-described method may be implemented.

According to an embodiment, an electronic device 10 may comprise a system on a chip SoC 11 and a power management unit PMU 13. The SoC 11 may comprise several electronic components 12, such as e.g. two central processing units CPU1, CPU2, a memory device and a general purpose input/output device GPIOS. The PMU 13 may comprise multiple power converter devices 14 which convert power supplied from e.g. a battery or from a mains-powered supply unit to the individual electronic components. As shown in FIG. 1, each power converter DC-DC1-4 is associated with a respective electronic component.

In general, the power P dissipated by any electronic component 12 of the electronic device 10 can be considered to be due to switching losses according to:

$$P = C * V^2 * f \qquad (1)$$

wherein C is the total capacitance of all the gates in the electronic component 12, V is the supply voltage of the electronic component 12 and f is the switching frequency of the electronic component 12.

Generally, only the supply voltage V in equation (1) is known, as it is the output voltage of the power converter 14 which supplies the electronic component 12. The total capacitance C may be hard to estimate, and the switching frequency f may not be constant. However, the power dissipated by the electronic component 12 is supplied by the associated power converter 14. Thus, a measurement of the power supplied by a specific power converter 14 can be used to determine the power dissipated by an electronic component 12.

If the thermal characteristic of the electronic component 12 is known, the temperature T of the electronic component 12 can be determined from the dissipated power P according to:

$$T=T_A+\theta_{JA}*P \qquad (2)$$

wherein $T_A$ is the ambient temperature and $\theta_{JA}$ is the thermal resistance of the electronic component "junction to ambience", i.e. including any functional elements of the electronic component 12 as well as any supply lines from the PMU. The thermal resistance $\theta_{JA}$ can be determined from:

$$\theta_{JA}=\theta_{JP}+\theta_{PA} \qquad (3)$$

wherein $\theta_{JP}$ is the thermal resistance "junction to package" and $\theta_{PA}$ is the thermal resistance "package to ambient". In general, the overall thermal resistance $\theta_{JA}$ of the electronic component 12 can be determined by summing up all of the individual thermal resistances of the elements of electronic component 12. These individual thermal resistances are typically supplied from the manufacturer or can be determined by measuring the temperature increase of an electronic component 12 for a given supply power.

Figure 2:
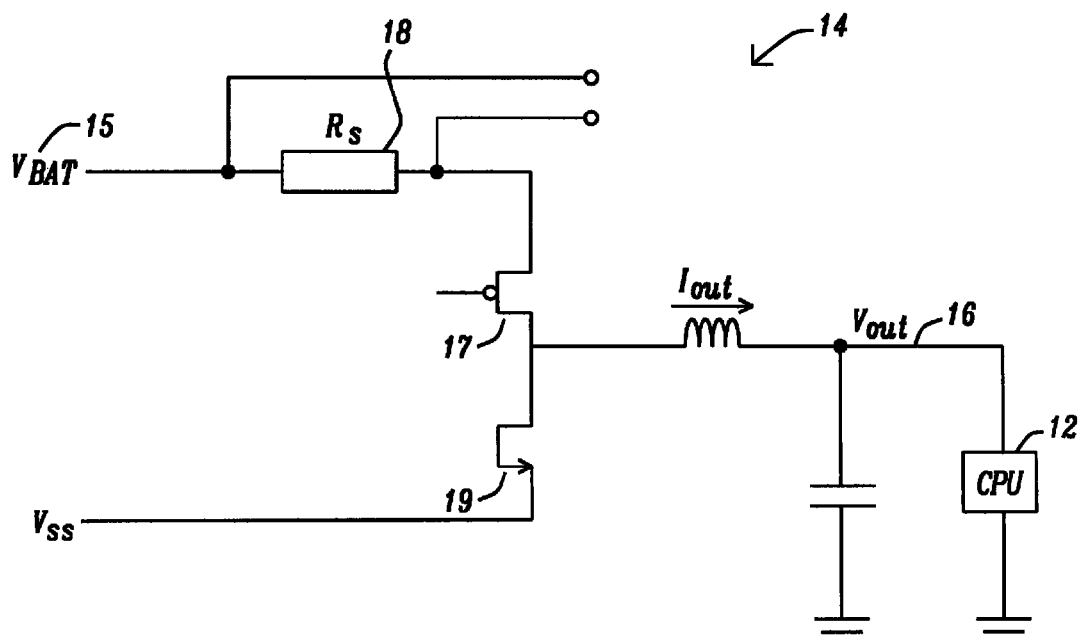
FIG. 2 shows a schematic circuit diagram of a power converter device according to an embodiment.

FIG. 2 shows an exemplary power converter device 14 for supplying a voltage $V_{out}$ and a current $I_{out}$ to an electronic component 12. The power converter 14 is configured to convert an input voltage $V_{BAT}$ at an input 15 of the power converter into an output voltage $V_{out}$ at an output 16 of the power converter 14. Typically, the power converter 14 is used to supply a load with a pre-determined load voltage (i.e. the output voltage $V_{out}$) and a load current $I_{out}$. The power converter 14 may be a switched-mode power supply performing e.g. a step-down voltage conversion. The power converter 14 may comprise a DC-to-DC converter (e.g. a buck converter) comprising a high side switch 17 and a low side switch 19. Alternatively, the power converter may comprise a boost converter or a buck-boost converter (also comprising a high side switch). The high side switch 17 may be a transistor, e.g. a PMOS or NMOS transistor.

As one example shown in FIG. 2, a power converter device 14 is provided with a sense resistor $R_s$ 18 in the current path, so that the input current $I_{BAT}$ to the power converter 14 can be measured as the voltage drop across the sense resistor $R_s$ 18. From the measured value for $I_{BAT}$, the current $I_{out}$ that is supplied to the electronic component 12, such as a CPU, can be determined according to:

$$I_{out}=\eta*D*I_{BAT} \qquad (4)$$

wherein $\eta$ is the efficiency of the power converter 14 which is usually known from the manufacturer's specifications for a given power converter device 14 and D is the duty cycle of the power converter 14 which is equal to $V_{out}/V_{BAT}$.

As the power provided to the electric device is equal to P=V*I
then, given equation (4), the power provided from the PMU to the electric component is $$P=\eta*VBAT*IBAT \qquad (5)$$

$V_{BAT}$ is generally known in the PMU as it is usually measured in a battery's charger system for battery-operated devices. For devices with a mains power supply, the supply voltage may be known from the specifications of the mains power supply and it may further be monitored within the device in order to ensure the correct operation of the mains power supply unit. In modern PMUs the supply is usually monitored by ADCs.

From equation (4) it can be seen that, if $I_{BAT}$ is measured in the power converter 14, the power P drawn by the electric component 12 can be determined according to equation (5) above.

Therein, only positive values of $I_{BAT}$ need to be considered, wherein a positive current is defined as current flowing from the power converter device 14 to the electronic component 12. Any negative current flow within the power converter device 14 does not represent power dissipated within the electronic component 12 or any activity of the electronic component 12, but may be caused e.g. by a reduction in output voltage $V_{out}$ of the power converter 14 or by switching or discharging of internal components of the power converter 14.

Then, the temperature T of the electronic component 12 can be determined according to equation (2). Additionally, if the respective value of the dissipated power $P_1$, $P_2$ for certain tasks performed by the electronic component 12 is known, the temperature change of the electronic component can be predicted according to:

$$\Delta T_{1-2}=T_A+\theta_{JA}*P_1-T_A+\theta_{JA}\cdot P_2=*\Delta P \qquad (6)$$

Figure 3:
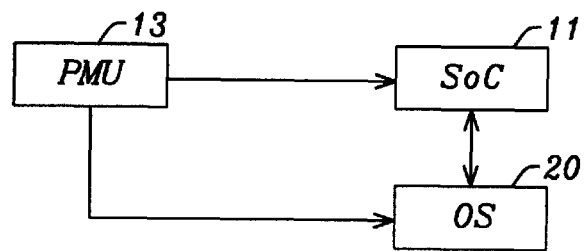
FIG. 3 shows a schematic overview of a control system for controlling operation of the electronic component.

As shown in FIG. 3, such a predicted or determined temperature value for an electronic component 12 can be used for establishing a control loop, wherein a control system, such as e.g. the operating system OS 20 of the electronic device, can control individual electronic components of the SoC 11, such as multiple CPUs, according to the temperature information provided as described above by the PMU 13. Thus, for the example device shown in FIG. 1, the operating system OS 20 can selectively control CPU1 and CPU2 depending on the temperature information provided by the associated power converters 14 at the PMU 13. Thus, if the temperature of one of the CPUs is determined or predicted to rise above a predetermined threshold value, the control system can decrease the load of this CPU (e.g. by reducing the operating frequency) and/or shift some of the processing load to the other CPU. Thus, the performance of the electronic device can be maintained at a substantially constant level while preventing the overheating of individual electronic components.

The method described above comprises the measurement of an input current (e.g. the battery current $I_{BAT}$) supplied to the power converter device 14. In the example shown in FIG. 2, this current measurement is performed by measuring the voltage drop over a resistor placed in the current path. In the following section, several further embodiments for implementing such an input current measurement are described.

Figure 4:
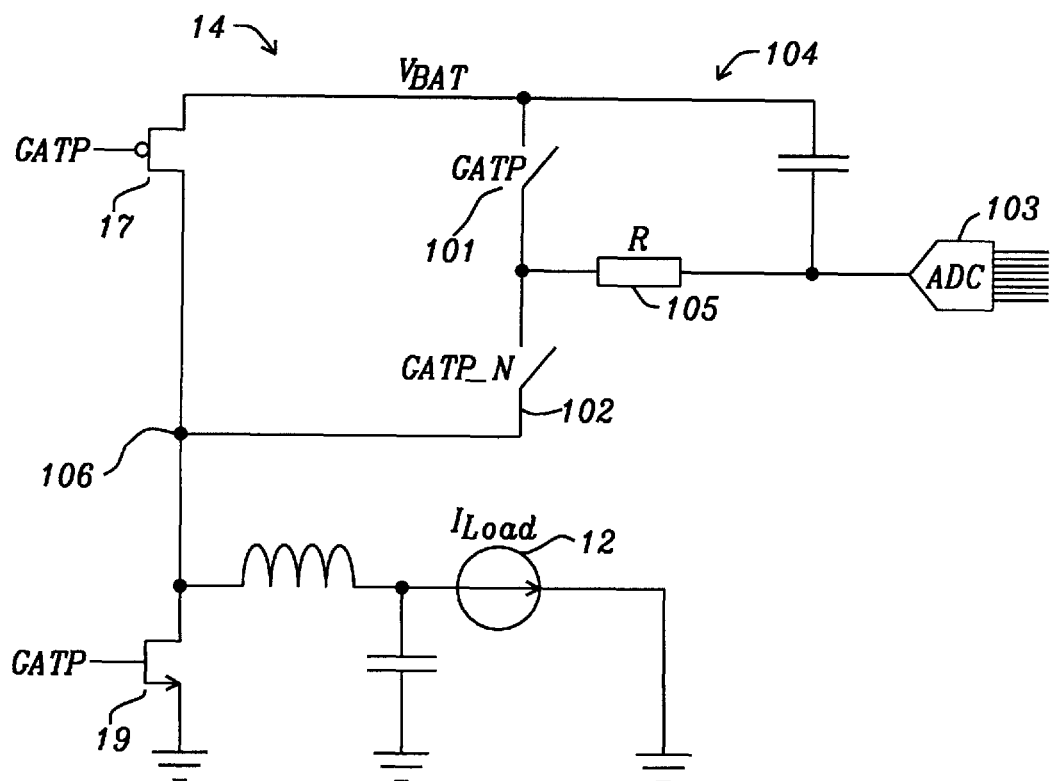
FIG. 4 shows a schematic circuit diagram of portions of a power converter device according to a further embodiment.

FIG. 4 shows an embodiment of a power converter 14 with a high side switch 17 and a low side switch 19. A low-pass filter is used at the switching node 106 of the high side switch 17. Therein, an RC circuit 104 is provided in parallel to the current path to the electronic component 12. The switching signal GATP at the high side switch 17 is used for controlling two switches GATP 101 and GATP_N 102. Switch GATP_N 102 is closed when a current is supplied via the high side switch 17 to the electronic component 12 and switch GATP 101 is closed when no current is supplied via the high side switch 17 to the electronic component 12. When switch GATP 101 is closed and switch GAT_N 102 is open, an analog-to-digital converter 103 is connected to $V_{BAT}$ via the RC-circuit 104. When switch GATP 101 is open and switch GATP_N 102 is closed, the ADC 103 is connected via the RC-circuit 104 to the switching node 106 of the current supply path to electronic component 12.

When the high side switch 17 is on, switch GATP 101 is open and switch GATP_N 102 is closed, so that the RC circuit 104 is connected to the switching node 106. When the high side switch 17 is off, the RC circuit is shortened to $V_{BAT}$ by the GATP switch 101, while switch GATP_N 102 is open. The input of the RC circuit 104 is thus $V_{BAT}-R_{on}*I_{load}$ when the high side switch 17 is on, and $V_{BAT}$ when the high side switch 17 is off, wherein $R_{on}$ is the internal resistance of the high side switch 17. The RC-circuit 104 filters the signal to provide a value indicative of the current of the high side switch 17 to the ADC 103.

Figure 5:
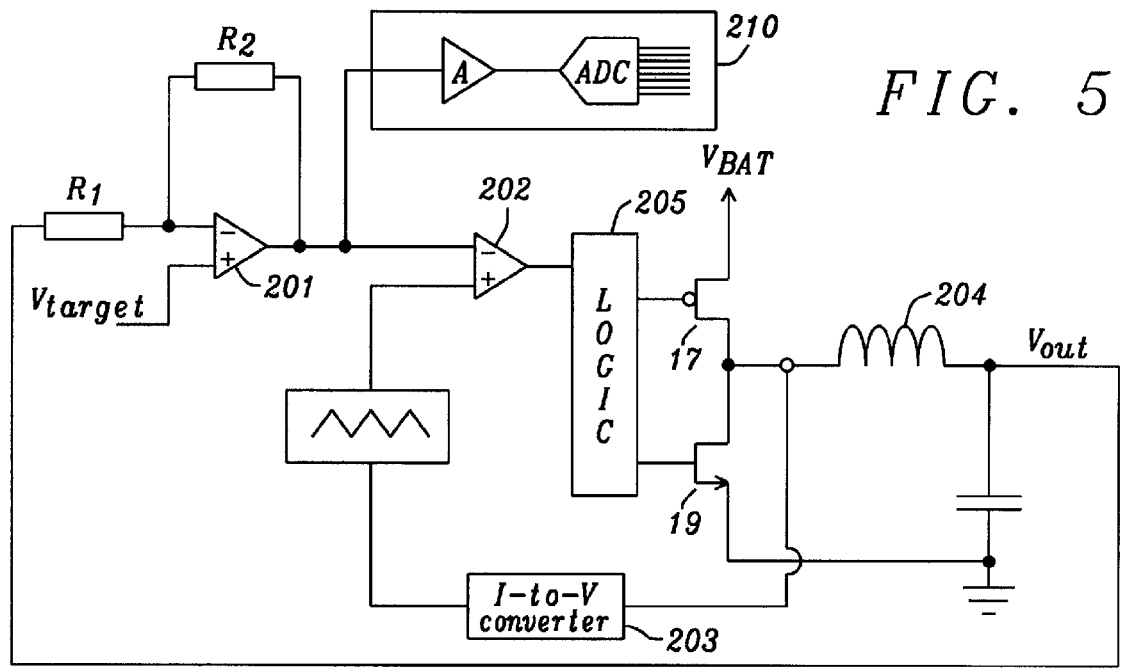
FIG. 5 shows a schematic circuit diagram of portions of a power converter device according to a further embodiment.

FIG. 5 shows an embodiment of a power converter, wherein an error amplifier 201 of a power converter device 14 is used to obtain information regarding the output current.

In the power converter shown in FIG. 5, the error amplifier 201 receives as its inputs the output voltage $V_{out}$ of the power converter 14 and a target value $V_{target}$ for the output voltage. The output of the error amplifier 201, i.e. the voltage difference $V_{error}$ between the actual output voltage $V_{out}$ and the target value $V_{target}$ is fed into a comparator 202 as a first input value. As a second input value, the comparator 202 further receives a measured value for the current at a converter coil 204, wherein the measured current value is converted into a voltage by an I-to-V converter 203 before it is input into the comparator 202. The output of the comparator 202 is fed into a logic circuit 205 which generates the pulse width modulation (PWM) signal for the operation of the high side switch 17 and the low side switch 19 of the power converter 14.

A measuring circuit 210 for determining the output current of the power converter 14 comprises an amplifier circuit and an analog-to-digital converter and is connected to the output of the error amplifier 201. This information is an indication of the current at the converter coil 204, as any change in load will lead to an increase in the output of the error amplifier 201.

The measured coil current which is converted to a voltage value at the I-to-V converter 203 could in principle also be used as an indication of the value of $I_{out}$. However, as the value determined at the I-to-V converter 203 is also used for stabilizing the output of the power converter device 14 and to set its load and line regulation, it is advantageous to set the I-to-V gain of the I-to-V converter 203 to be not too small to guarantee stability but also not too big to guarantee good load and line regulation. For a current measurement, however, it would be advantageous to set the I-to-V gain of the I-to-V converter 203 to a larger value in order to utilize the full input range of the ADC. For this reason, the error amplifier output can be probed without affecting the loop characteristics of the converter, and the output of the error amplifier can then be amplified before it is input to the ADC.

Figure 6:
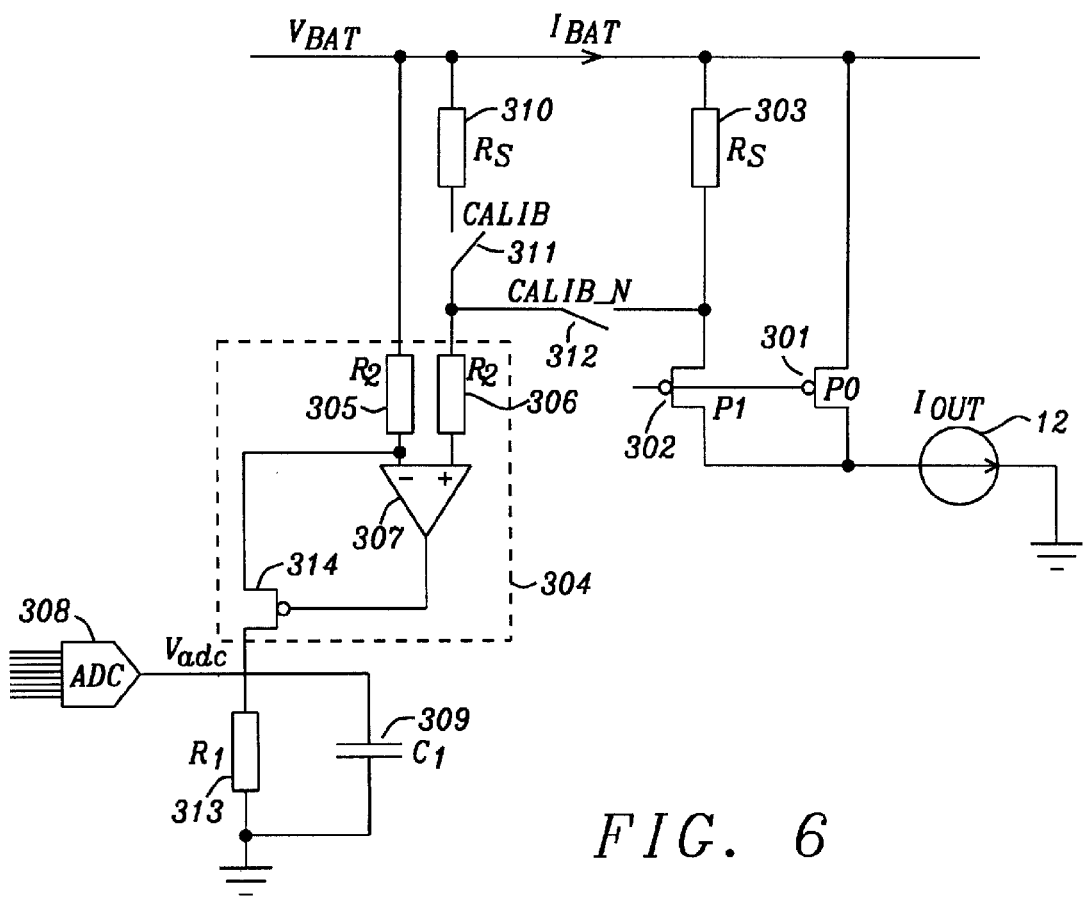
FIG. 6 shows a schematic circuit diagram of portions of a power converter device according to a further embodiment.

FIG. 6 shows a further embodiment of a power converter which enables a measurement of the input current. A main pass device. P0 301 is connected to the electronic component 12. An auxiliary pass device P1 302 is connected in parallel to the main pass device P0 301 and switched together with the main pass device P0 301 based on a converter control signal. A sense resistor $R_s$ 303 is connected in series to the auxiliary pass device 302 and an amplifier circuit 304 is provided for amplifying a voltage drop across the sense resistor $R_s$ 303.

The amplifier circuit 304 comprises two identical resistors $R_2$ 305, 306, a differential amplifier 306 and a field effect transistor 314. The differential amplifier is connected, with its negative input terminal, to one of the resistors $R_2$ 305 and a terminal of the field effect transistor 314, and with its positive input terminal, to the sense resistor $R_s$ 303, via the other one of the resistors $R_2$ 306 and a switch 311 connected in series. The output of the differential amplifier 307 is connected with the gate of the field effect transistor 314. A first terminal of the field effect transistor 314 is connected with the negative input terminal of the differential amplifier 307, and a second terminal of the field effect transistor 314 forms the output of the amplifier circuit 304.

An analog to digital converter ADC 308 is provided which receives the voltage $V_{adc}$ at the output of the amplifier circuit 304 and outputs the measured value for the input current to the electronic component 12. A resistor $R_1$ 313 is provided for scaling the output voltage of the amplifier circuit 304 by converting the current through the field effect transistor 314 into a voltage. A capacitor $C_1$ 309 may be provided for dampening voltage fluctuations during a measurement interval where current flows through the auxiliary pass device P1 302 so that an averaged current $I_{out}$ can be determined from $V_{adc}$. In this arrangement, the voltage drop at the sense resistor $R_s$ 303 which is connected in series to the auxiliary pass device P1 302 is amplified by a factor of $R_1/R_2$.

A calibration resistor $R_s$ 310 is connectable between the positive input of the amplifier circuit 304 and the supply voltage $V_{BAT}$ to the power converter device 14. The negative input of the amplifier circuit 304 is connected to the supply voltage $V_{BAT}$ to the power converter device 14. Switches Calib 311 and Calib_N 312 are provided for connecting the positive input of the amplifier circuit 304 either to the sense resistor $R_s$ 303 or to the calibration resistor $R_s$ 310.

For each measurement, first, the calibration resistor $R_s$ 310 is connected to the amplifier circuit 304 in order to determine the voltage drop at zero output current. Subsequently, the sense resistor $R_s$ 303 is connected to the amplifier circuit 304 in order to measure the input current supplied to the electronic component 12.

When the output current is zero, the resistance seen from the Calib_N node to $V_{BAT}$ is very close to the resistance of the sense resistor $R_s$ 303. The parallel resistances of the main and the auxiliary pass devices P1, P0 do not influence the resistance seen from the Calib_N node to $V_{BAT}$ in the case of zero current being output, because the resistance of the main pass device P0 is negligible while in general the resistance of the auxiliary pass device P1 is designed to be bigger than the resistance of the sense resistor $R_s$ 303. When the current $I_{out}$ is zero, the only current flowing in the sense resistor $R_s$ 303 and in the auxiliary pass device P1 302 is the current of the amplifier. This current will flow mostly in the sense resistor $R_s$ 303 when the switch Calib_N 312 is closed for the reasons stated above. When the switch Calib 311 is closed, the same current will flow in the calibration resistor $R_s$ 310, giving the same voltage drop. Thus, a measurement of the voltage drop at the calibration resistor $R_s$ 310, while the Calib switch 311 is closed and the Calib_N switch 312 is open, leads to substantially the same voltage value as a measurement of the voltage drop at the sense resistor $R_s$ 303 when no current is supplied to the electronic component 312.

The circuit is sized such that, at zero output current, voltage $V_{ped}$ is generated at the $V_{adc}$ node. In order to be able to measure only positive current, this pedestal voltage is chosen such that $$V_{adc\_0}=V_{ped}=G_I*I_{LPK\_neg} \qquad (7)$$

wherein $G_I$ is the current to voltage gain from the output current to the voltage $V_{adc}$ and $I_{LPK\_neg}$ is half the ripple of the output current. Therein, the output current has a triangular wave shape due to the inductance of the output coil of the power converter device 14. The ripple of the output current corresponds to the peak-to-peak difference of the triangular wave, and $I_{LPK\_neg}$ represents half the peak-to-peak difference of the output current.

During the calibration, $V_{adc}$ will be equal to $V_{ped}$ as the positive and negative inputs of the amplifier circuit 304 are connected to the same potential $V_{BAT}$. The difference between $V_{adc}$ during the measurement of the current using the sense resistor $R_s$ 303 at the auxiliary pass device P1 302 and $V_{ped}$ can be measured by the ADC 308 and it will be equal to:

$$V_{adc}-V_{ped}=V_{meas}=(I_{out}*R_{on}*R_s)/(R_s+N*R_{on})*R_2/R_1 \qquad (8)$$

The measurement of the $V_{ped}$ voltage at zero current flow in the auxiliary pass device P1 302 ensures that $V_{meas}$ is output at 0V when no current is supplied to the electronic component 12. Any negative values of $V_{meas}$ can be discarded, as they do not correspond to power dissipated within the electronic component 12 and thus do not contribute to the temperature of the electronic component 12. If a determination and correction of the voltage offset $V_{ped}$ is not desired, the resistors $R_2$ 305, 306 within the amplifier circuit 304 can also be omitted.

The device shown in FIG. 6 enables a measurement of the positive input current from the power converter 14 to the electronic component 12 which is independent of the mode at which the power converter 14 is operated, which does not require any external components and which does not change the overall resistance $R_{on}$ of the power converter 14 as the sense resistor $R_s$ 303 for the current measurement is not in the main current path of the main pass device P0 301.

In a modification of the example device described above, the current measurement could also happen in another location. For example, the current measurement could be performed at the drain of the auxiliary pass device if a circuitry was used that forces the drain of the main pass device to be equal to the drain of the auxiliary pass device. The described principle also works if the high side switch is an n-MOS instead of the p-MOS as shown in the figures.

The presented principle of power management also applies to the PMU and the power dissipation of the PMU could be determined the same way.

In order to increase the accuracy of the determined temperature values, a learning curve could be obtained by comparing the current measurements with temperature measurements from sensors provided near the electronic component and adjusting the value for the thermal resistance of the electronic component accordingly.

Figure 7:
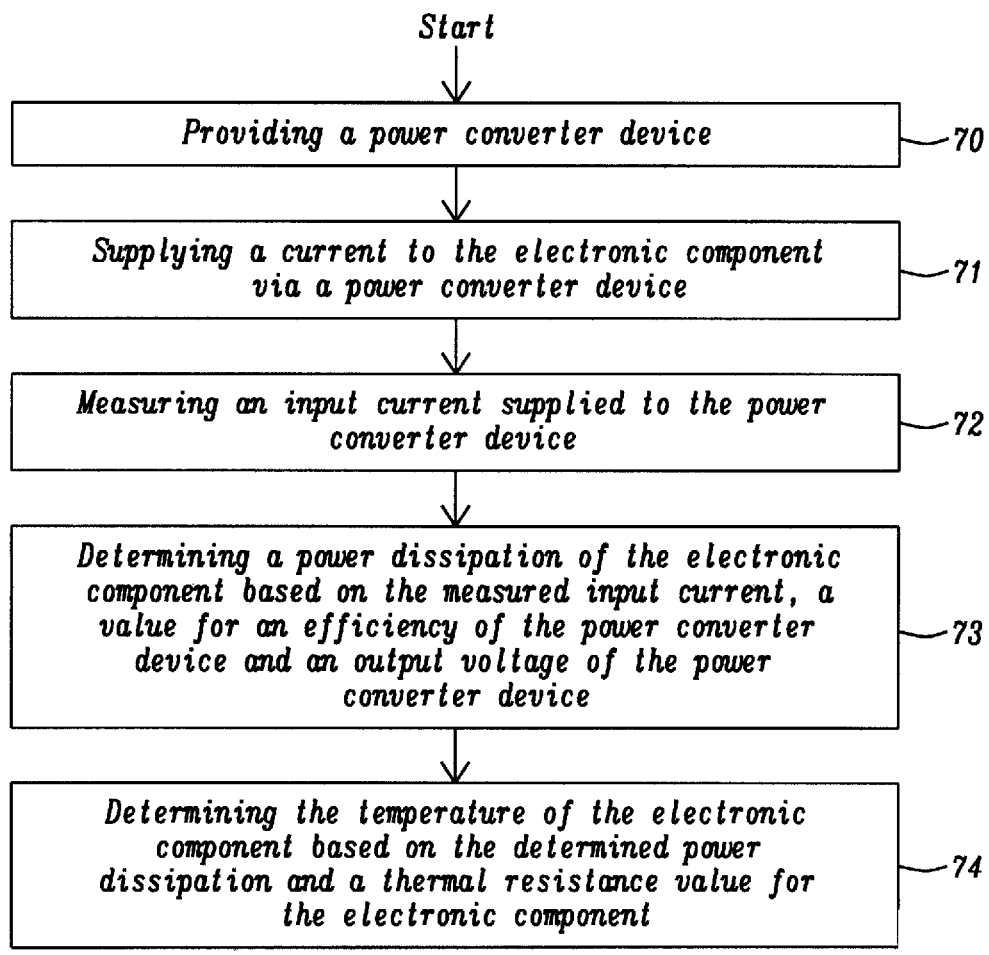
FIG. 7 shows a flowchart illustrating the method for determining the temperature of an electronic component in an electronic device.

FIG. 7 shows a flowchart illustrating the method for determining the temperature of an electronic component in an electronic device. The first method step 70 depicts providing a power converter device. The following step 71 shows supplying a current to the electronic component via the power converter device. Step 72 deals with measuring an input current supplied to the power converter device and step 73 illustrates determining a power dissipation of the electronic component based on the measured input current, a value for an efficiency of the power converter device and an output voltage of the power converter device. The last step shown in FIG. 7 depicts determining the temperature of the electronic component based on the determined power dissipation and a thermal resistance value for the electronic component.

The various embodiments of the present method and device enable a fast and accurate determination of the current supplied to an electronic component, which allows a fast and accurate determination of the electronic component's temperature. Thus, the operation of an electronic device can be controlled such that overheating of individual components can be avoided without the need for complete shutdowns. Further, the various embodiments of a power converter device provide different ways of determining the current supplied to an electronic component without affecting the performance, in particular the efficiency, of the power converter device.

It should be noted that the description and drawings merely illustrate the principles of the proposed methods and devices. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Finally, it should be noted that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. Method for determining the temperature of an electronic component in an electronic device, the method comprising:
   providing a power converter device;
   supplying a current to an electronic component via the power converter device, the power converter device being a switched-mode power converter,
   measuring an input current supplied to the power converter device,
   measuring an input voltage to the power converter device,
   determining a power dissipation of the electronic component based on the measured input current, a value for an efficiency of the power converter device and the measured input voltage of the power converter device,
   determining the temperature of the electronic component based on the determined power dissipation and a thermal resistance value for the electronic component,
   providing the determined temperature of the electronic component to a control system, and
   controlling an operation of the electronic component according to the determined temperature of the electronic component.

2. Method according to claim 1, wherein the step of determining the power dissipation of the electronic component comprises calculating the power dissipated in the electronic component according to:

$$P=\eta*I_{in}*V_{in}$$

wherein:
$\eta$ is the efficiency of the power converter device, $V_{in}$ is the voltage supplied to the power converter device, and $I_{in}$ is the input current to the power converter device.

3. Method according to claim 1, wherein the step of determining the
temperature of the electronic component from the power dissipation and the
thermal resistance value comprises calculating the temperature T of the electronic component according to:

$$T=T_A+\theta*P$$

wherein $T_A$ is the ambient temperature, $\theta$ is the thermal resistance for the electronic component and P is the power dissipation of the electronic component.

4. Method according to claim 1, wherein the step of determining the temperature of the electronic component comprises:
obtaining values for the power dissipation of the electronic component for a first task and a second task performed by the electronic component, and
calculating a change in temperature, $\Delta T$, of the electronic component when the electronic component changes from performing the first task to performing the second task according to:

$$\Delta T=\theta*\Delta P$$

wherein $\theta$ is the thermal resistance for the electronic component and $\Delta P$ is the difference in power dissipation of the electronic component for the first and the second task.

5. Method according to claim 1, further comprising calibration wherein any voltage offsets that are produced within the power converter device even when zero current is supplied to the electronic component can be cancelled out.

6. Method according to claim 1, wherein the step of measuring the input current supplied to the power converter device is performed using:
an auxiliary pass device connected in parallel to a main power converter pass device and switched together with the main power converter pass device, and
a sense resistor connected in series to the auxiliary pass device, and wherein the step of measuring the input current comprises determining a voltage drop across the sense resistor.

7. Method according to claim 6, wherein a calibration resistor is arranged in parallel to the sense resistor such that a voltage drop across the calibration resistor corresponds to a voltage drop at the sense resistor for a zero current through the auxiliary pass device, and wherein the step of measuring an input current comprises determining the voltage drop at the sense resistor, determining the voltage drop at the calibration resistor, and determining a difference between the voltage drop at the sense resistor and the voltage drop at the calibration resistor.

8. Method according to claim 1, wherein only a positive current flowing through a power converter pass device is considered for determining the power dissipation of the electronic component.

9. Method according to claim 1, wherein in order to increase the accuracy of the determined temperature values, a learning curve is obtained by comparing the current measurements with temperature measurements from sensors provided near the electronic component and adjusting the value for the thermal resistance of the electronic component accordingly.

10. Method according to claim 1, wherein the electronic device comprises a system on a chip (SoC) and a power management unit.

11. Method according to claim 10, wherein the power management unit comprises multiple power converter devices which convert power supplied from a battery or from a mains-powered supply unit to the individual electronic components.

12. Power converter for supplying a current to an electronic component, comprising:
a main pass device connected to the electronic component,
an auxiliary pass device connected in parallel to the main pass device and switched together with the main pass device based on a converter control signal,
a sense resistor connected in series to the auxiliary pass device,
an amplifier circuit for amplifying a voltage drop across the sense resistor,
a calibration resistor connectable with the amplifier circuit such that a voltage drop across the calibration resistor corresponds to a voltage drop at the sense resistor for a zero output current supplied to the electronic component, and
a converter circuit for providing a value indicative of the current that is supplied to the electronic component, based on a measured voltage at the output of the amplifier circuit.

13. Power converter according to claim 12, further comprising:
a first switch connecting the calibration resistor with an input of the amplifier circuit,
a second switch connecting the sense resistor with the input of the amplifier circuit, and
a switch control unit for controlling the first and second switch,
wherein the converter circuit is configured to:
measure the voltage at the output of the amplifier circuit when the first switch connects the calibration resistor with the amplifier circuit,
measure the voltage at the output of the amplifier circuit when the second switch connects the sense resistor with the amplifier circuit, and
determine the difference between the output voltage of the amplifier circuit when the first switch connects the calibration resistor with the amplifier circuit and when the second switch connects the sense resistor with the amplifier circuit.

14. Power converter according to claim 12, wherein the amplifier circuit comprises a differential amplifier and a field effect transistor, the gate of the field effect transistor connected with the output of the differential amplifier, a first terminal of the field effect transistor connected with a negative input terminal of the differential amplifier, and a second terminal being the output of the amplifier circuit.

15. Power converter according to claim 14, wherein the amplifier circuit further comprises a first and a second input resistor having the same resistance value, the first input resistor connected with the power converter input voltage and the negative input terminal of the differential amplifier, a terminal of the second input resistor connected with the first and second switches and another terminal of the second input resistor connected with a positive input terminal of the differential amplifier.

16. Power converter according to claim 12, further comprising a passive network connected with the output of the amplifier circuit, the passive network comprising a resistor, wherein the gain of the amplifier circuit is determined by the ratio of the resistance of the passive network resistor to the resistance of the amplifier circuit input resistors.

17. Power converter according to claim 16, the passive network further comprising a capacitor connected in parallel to the resistor.

18. Power converter according to claim 12, wherein an error amplifier of the power converter device is used to obtain information regarding the output current wherein the error amplifier receives as its inputs an output voltage of the power converter and a target value for the output voltage of the power converter.

19. Power converter according to claim 18, wherein the output of the error amplifier is fed into a comparator as a first input value.

20. Power converter according to claim 19, wherein as a second input value, the comparator further receives a measured value for the current at a converter coil, wherein the measured current value is converted into a voltage by a current-to-voltage converter before it is input into the comparator.

* * * * *